United States Patent [19]

Baliga

[11] Patent Number: 4,466,173
[45] Date of Patent: Aug. 21, 1984

[54] METHODS FOR FABRICATING VERTICAL CHANNEL BURIED GRID FIELD CONTROLLED DEVICES INCLUDING FIELD EFFECT TRANSISTORS AND FIELD CONTROLLED THYRISTORS UTILIZING ETCH AND REFILL TECHNIQUES

[75] Inventor: Bantval J. Baliga, Clifton Park, N.Y.

[73] Assignee: General Electric Company, Schenectady, N.Y.

[21] Appl. No.: 324,328

[22] Filed: Nov. 23, 1981

[51] Int. Cl.³ .................. H01L 21/20; H01L 21/74
[52] U.S. Cl. ............................ 29/571; 29/576 E; 29/578; 29/580; 148/175; 156/647; 156/653; 156/657; 357/22; 357/23; 357/56; 357/89
[58] Field of Search ............ 29/571, 578, 580, 576 E; 148/175; 156/647, 653, 657; 357/22, 23, 56, 89

[56] References Cited

U.S. PATENT DOCUMENTS

| | | | |
|---|---|---|---|
| 3,465,216 | 9/1969 | Teszner | 357/22 X |
| 3,579,055 | 5/1971 | Ross . | |
| 3,716,422 | 2/1973 | Ing et al. | 148/175 |
| 3,899,362 | 8/1975 | Cline et al. | 148/1.5 |
| 3,904,442 | 9/1975 | Anthony et al. | 148/1.5 |
| 3,938,241 | 2/1976 | George et al. | 29/571 |
| 3,969,746 | 7/1976 | Kendall et al. | 148/175 X |
| 3,979,230 | 9/1976 | Anthony et al. | 148/1.5 |
| 3,979,820 | 9/1976 | Anthony et al. | 29/577 |
| 3,982,268 | 9/1976 | Anthony et al. | 148/1.5 X |
| 3,988,772 | 10/1976 | Krishna | 357/64 |
| 3,998,661 | 12/1976 | Chang et al. | 148/1.5 |
| 3,998,662 | 12/1976 | Anthony et al. | 148/1.5 |
| 4,006,040 | 2/1977 | Cline et al. | 148/1.5 |
| 4,037,245 | 7/1977 | Ferro | 357/22 X |
| 4,060,821 | 12/1977 | Houston et al. | 357/22 |
| 4,106,044 | 8/1978 | Yoshida et al. | 357/22 |
| 4,115,793 | 9/1978 | Nishizawa | 357/22 |
| 4,128,440 | 12/1978 | Baliga | 148/171 |
| 4,132,996 | 1/1979 | Baliga | 357/21 |
| 4,170,019 | 11/1979 | Hysell et al. | 357/22 |
| 4,171,995 | 10/1979 | Nishizawa et al. | 148/175 |
| 4,251,299 | 2/1981 | Baliga et al. | 148/171 |
| 4,309,714 | 1/1982 | Slatter | 357/22 |
| 4,328,611 | 5/1982 | Harrington et al. | 29/578 X |

OTHER PUBLICATIONS

D. E. Houston et al., "A Field Terminated Diode", *IEEE Trans. Electron Devices*, vol. ED–23, No. 8, pp. 905–911, (Aug. 1976).

B. M. Berry, "Epitaxy", Sec. III, pp. 347–470, in Silicon Integrated Device Technology, vol. 1, Ed. by R. M. Burger & R. P. Donovan, Prentice-Hall, (1967).

J. I. Nishizawa, R. Terasaki, J. Shibata, "Field–Effect Transistor Versus Analog Transistor (Static Induction Transistor)", *IEEE Trans. Electron Devices*, vol. ED 22, pp. 185–199, (1975).

B. J. Baliga, "Buried Grid Fabrication by Silicon Liquid–Phase Epitaxy", Appl. Phys. Lett., vol. 34, pp. 789–790, (1979) & vol. 35, p. 649, (1979).

B. J. Baliga, "Power Field Controlled Thyristors Fabricated Using Silicon Liquid Phase Epitaxy", *Device Research Conference*, Paper WP-B7, (1979).

D. P. Lecrosnier et al., "Ion-Implanted FET for Power Applications", *IEEE Trans. Electron Devices*, vol. ED–21, pp. 113–118, (1974).

Baliga et al., U.S. Pat. Appln. Serial No. 169,853, filed Jul. 17, 1980, "Planar Gate Turn–Off Field Controlled Thyristors etc.".

D. L. Kendall, "On Etching Very Narrow Grooves in Silicon", *Appl. Phys. Lett.*, vol. 26, pp. 195–198, (1975). Abstract of Talk: B. J. Baliga, "Rectangular Buried Grid Fabrication", Meeting of Electrochemical Society, Electronics Div., at Diplomat Hotel, Hollywood, Fla., pp. 5–6, (Oct. 9–10, 1980).

*Primary Examiner*—W. G. Saba
*Attorney, Agent, or Firm*—Charles E. Bruzga; James C. Davis, Jr.; Marvin Snyder

[57] ABSTRACT

Methods for fabricating vertical channel buried grid field controlled devices with improved performance characteristics include methods which avoid the problems caused by autodoping effects. In one form of the invention, one surface of a semiconductor substrate is preferentially etched to form substantially vertically-walled grooves, and the grooves are selectively refilled employing vapor phase epitaxial growth to form a grid structure. A semiconductor layer is then epitaxially grown over the substrate surface and grid so as to bury the grid. In another form of the invention, grooves are preferentially etched in semiconductor substrate to achieve steep vertical walls. Thereafter, the grooves are either partially refilled by means of epitaxial growth or, preferably, completely refilled and then again preferentially etched to remove a predetermined fraction of the refilling. A second epitaxial refill is done to fill the remainder of the grooves. While autodoping can occur during this second epitaxial refill, the autodoping only extends the grid region upwards by a few microns, and cannot cause shorting between the grids.

18 Claims, 10 Drawing Figures

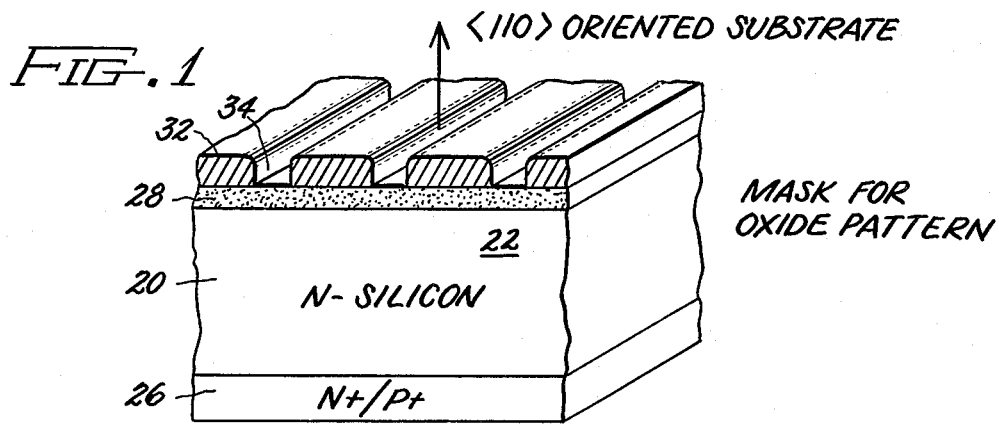
FIG. 1 — MASK FOR OXIDE PATTERN
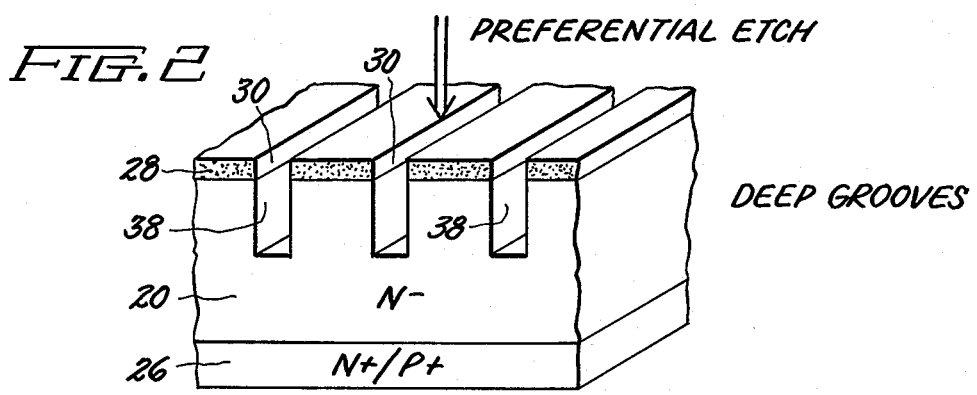
FIG. 2 — DEEP GROOVES
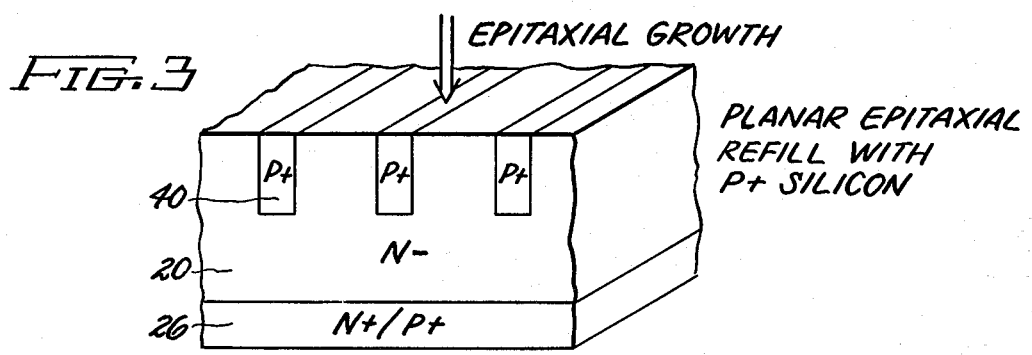
FIG. 3 — PLANAR EPITAXIAL REFILL WITH P+ SILICON
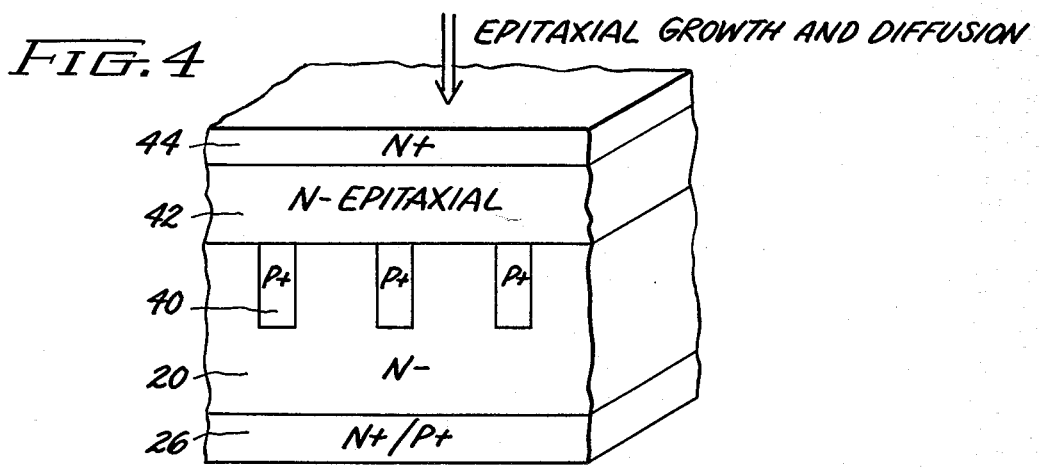
FIG. 4 — EPITAXIAL GROWTH AND DIFFUSION

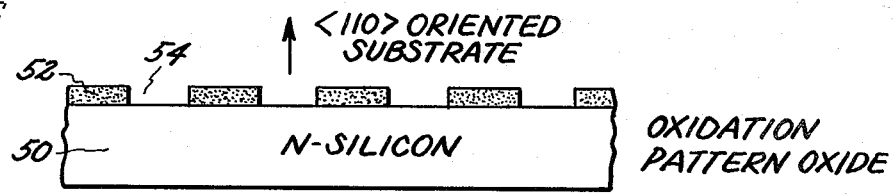
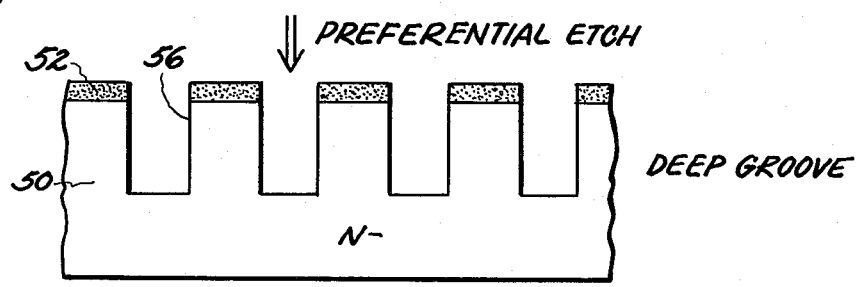
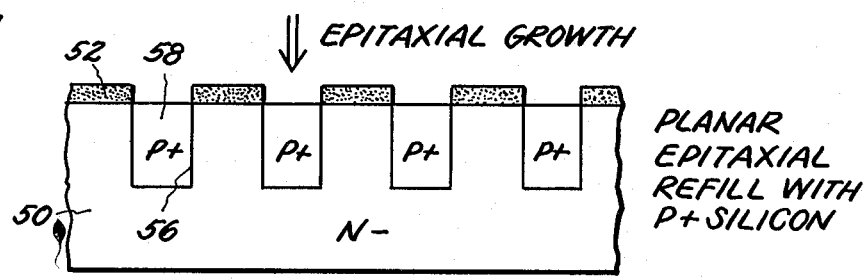
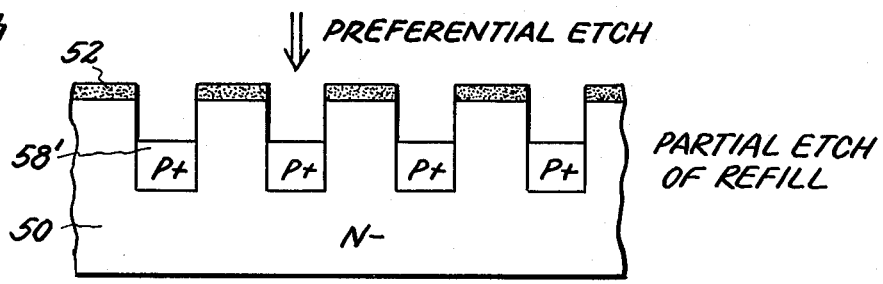
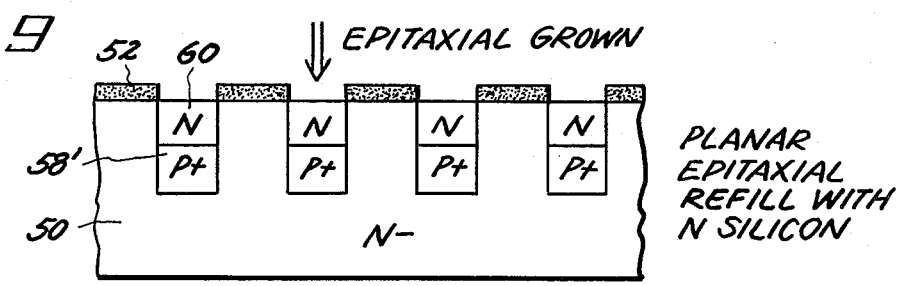
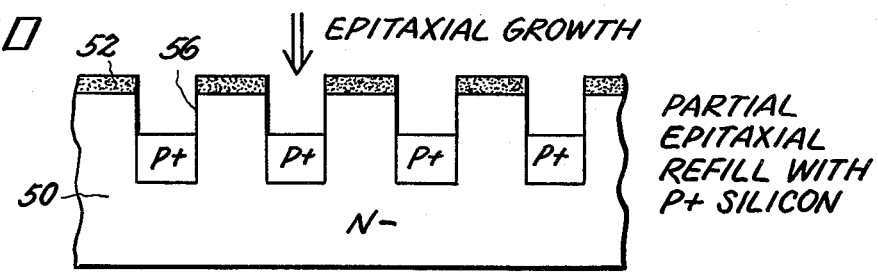

METHODS FOR FABRICATING VERTICAL CHANNEL BURIED GRID FIELD CONTROLLED DEVICES INCLUDING FIELD EFFECT TRANSISTORS AND FIELD CONTROLLED THYRISTORS UTILIZING ETCH AND REFILL TECHNIQUES

BACKGROUND OF THE INVENTION

The present invention relates generally to vertical channel electric field controlled semiconductor devices such as field effect transistors and field controlled thyristors and, more particularly, to methods for fabricating buried grids for such devices.

Various forms of vertical channel field controlled semiconductor devices are known. These include field controlled thyristors (FCTs), a variation sometimes termed a field terminated diode (FTD), as well as field effect transistors (FETs). These devices are potentially capable of switching voltages in the order of 50 to 1000 volts, with currents of from 1 to 100 amperes, at frequencies greater than 15 kHz, exceeding the capabilities of conventional bipolar devices.

Such devices are described in the literature, for example, D. E. Houston, S. Krishna, D. E. Piccone, R. J. Finke and Y. S. Sun, "A Field Terminated Diode", *IEEE Trans. Electron Devices,* Vol. ED-23, No. 8, pp. 905–911. (Aug. 1976). In addition to this Houston et al literature reference, various forms of such devices are disclosed in the commonly-assigned patents to Ferro U.S. Pat. No. 4,037,245, Houston et al U.S. Pat. No. 4,060,821, Baliga U.S. Pat. No. 4,132,996, and Hysell et al U.S. Pat. No. 4,170,019. Additional disclosures are found in commonly-assigned Baliga and Wessels U.S. patent application Ser. No. 169,853 filed July 17, 1980, entitled "PLANAR GATE TURN OFF FIELD CONTROLLED THYRISTORS AND PLANAR JUNCTION GATE FIELD EFFECT TRANSISTORS, AND METHOD OF MAKING SAME", which is a continuation of now-abandoned application Ser. No. 938,020, filed August 30, 1978, in turn a continuation-in-part of now-abandoned application Ser. No. 863,877, filed Dec. 23, 1977.

Briefly, in a thyristor or diode form of a field controlled device, a P+ anode, N− base, and N+ cathode structure is provided, with the N− base region containing a low resistivity P+ grid or gate defining a number of vertical channels. In general, the device functions as a power rectifier with forward blocking capability and gate turn off capabilities. Field effect transistors of similar structure may also be provided, in which case, rather than a P+ anode region there is an N+ drain region.

In plan view, the grid may take a variety of geometric forms. Described herein are grids comprising a plurality of parallel elongated elements, although it will be appreciated that the invention is not so limited.

There are two general structures for these devices: planar structures wherein the grid is on the surface of the device, and buried grid structures wherein the grid is buried within the base region. Buried grid devices have the advantage of increased cathode (or source) area compared to planar devices because, in planar devices, the cathode (or source) region must be located between the grids and sufficiently separated to obtain an acceptably high grid-cathode (or grid-source) breakdown voltage. Buried grid structures overcome this particular problem, and enable a higher blocking gain to be achieved. It should be noted, however, that the inability to metallize a buried gate along its entire length results in higher grid resistance, and thus limits the frequency response of buried grid FETs and FCTs.

A hybrid approach is disclosed in the above-identified commonly-assigned Houston et al U.S. Pat. No. 4,060,821 wherein the grid is divided into surface grid portions and buried grid portions, with the buried grid having a greater lateral extent; at the device surface, the surface area of the cathode structure is substantially greater than that of the grid structure.

The Houston et al literature reference describes both planar grid and buried grid devices, and the fabrication of such devices by means of diffusion technique. In particular, to form a buried grid, an appropriate mask pattern is applied to the surface of an N− type base substrate, and P+ grid regions are diffused into the surface of the base. Thereafter, the grid is covered or buried with N− type layer grown using vapor phase epitaxy. This layer has conductivity essentially identical to that of the base substrate. The base substrate and the epitaxially-grown layer then, together, form the overall base region. Thereafter, the cathode or source region is diffused into the upper surface of the epitaxially-grown layer comprising the base region, and metallization applied to complete the device. Further descriptions of the technique are found in the literature: B. M. Berry, "Epitaxy", Section III, pp. 347–470, in "Silicon Integrated Device Technology", Vol. 1, Edited by R. M. Burger and R. P. Donovan, Prentice-Hall, Inc. (1967); and J. I. Nishizawa, R. Terasaki, and J. Shibata, "Field-Effect Transistor Versus Analog Transistor (Static Induction Transistor)", *IEEE Trans. Electron Devices,* Vol. ED22, pp. 185–197 (1975).

While described herein primarily in the context of the fabrication of buried grids for electric field devices, it will be appreciated that similar buried regions are found in other devices and integrated circuits and that the techniques described herein are applicable to some of these as well.

One particular and potentially serious problem which arises during the formation of buried grid structures by vapor phase epitaxial growth to bury the grid structure is autodoping. Autodoping is caused by the P+ type dopant of the grid region entering the gas phase during initial stages of epitaxial growth. This can result in a severe distortion in the shape of the buried grid region or, even worse, a short in the form of a connecting layer between the grid regions, preventing the fabrication of the buried grid structure.

One method for avoiding autodoping effects, successfully used in the fabrication of closely spaced buried grid regions and in the development of buried grid field controlled thyristors, is to grow the epitaxial layers from the liquid phase. This is described in the literature: B. J. Baliga, "Buried Grid Fabrication by Silicon Liquid-Phase Epitaxy", *Appl. Phys. Lett.,* Vol. 34, pp. 789–790 (1979) and *Appl. Phys. Lett.,* Vol. 35, p. 647 (1979); and B. J. Baliga, "Power Field Controlled Thyristors Fabricated Using Silicon Liquid Phase Epitaxy", *Device Research Conference,* Paper WP-B7 (1979); see *IEEE Trans. Electron Devices,* Vol. ED 26, p. 1858 (1979). Similar disclosures are found in commonly-assigned Baliga U.S. Pat. No. 4,128,440 entitled "Liquid Phase Epitaxial Method of Covering Buried Regions for Devices", and Baliga et al U.S. Pat. No. 4,251,299 entitled "Planar Epitaxial Refill Using Liquid Phase Epitaxy". The present invention, however, is directed to methods employing vapor phase epitaxy to cover buried structures.

As pointed out in the above-identified commonly-assigned application Ser. No. 169,853, another problem is that the shape of a buried grid formed by means of diffusion is somewhat semi-cylindrical, and this results in a poor channel length-to-width ratio. This leads to a relatively poor blocking gain, requiring closely-spaced grids, which in turn, reduce the conduction area of the device.

The above-identified Baliga and Wessels application Ser. No. 169,853, goes on to describe planar, junction gate FETs and FCTs having higher forward blocking capabilities and higher blocking gains than diffused-grid devices. In particular, described are gate or grid regions comprising substantially vertical walls, such that the grids are rectangular in cross-section. As there described, preferential etch and refill techniques are employed to achieve the substantially vertical walls and rectangular cross sections.

Comparisons of surface (planar) grid field controlled devices having grid regions having cylindrically shaped walls fabricated by planar diffusion as described in the Houston et al article entitled, "A Field Terminated Diode" to planar grid field controlled devices including grid regions with vertical walls fabricated using the epitaxial refill technique have shown that a significantly higher blocking gain is observed in the planar devices with vertically walled gate regions. Accordingly, it has recently been recognized that similar improvement in the blocking gain of buried grid devices is to be expected by replacing the conventional cylindrically walled grid regions fabricated by planar diffusion with vertically walled grid regions.

The buried rectangular cross-section grid structure is advantageous compared with the diffused grid structure of the Houston et al literature reference in that grid spacing can be larger due to improved channel length-to-width ratio, resulting in increased active area and reduced forward voltage drop. Compared with the planar grid device of the above-identified commonly-assigned Baliga et al application Ser. No. 169,853, the cathode area is larger. (Grid resistance limitations do, however, remain).

SUMMARY OF THE INVENTION

Accordingly, it is an object of the invention to provide methods for fabricating vertical channel buried grid field controlled devices such as field effect transistors (FETs) and field controlled thyristors (FCTs).

It is another object of the invention to provide fabrication methods for such devices, as well on other devices having buried regions, which eliminate problems caused by autodoping effects when employing vapor phase epitaxial growth to cover the buried regions.

Briefly, and in accordance with an overall concept of the invention, rectangular-channel buried-grid field controlled devices are fabricated by employing a preferential etch and refill technique as disclosed in the Baliga et al application Ser. No. 169,853, followed by epitaxial growth to bury the grid structure, such as is described in the above-identified reference Houston et al article, "A Field Terminated Diode".

In accordance with a more particular aspect of the invention, there is provided a method for fabricating a buried grid structure for a vertical channel electric field device such as a field controlled thyristor or a field effect transistor of the type including a semiconductor base region of one conductivity type (for example, N−type) with the grid structure being of opposite conductivity type (for example, P+ type) and buried in the base region, and a substantially uniform electrode region of the one conductivity type but of higher conductivity than the base region (N+ type) at one surface of the base region. In the case of a field controlled thyristor, this electrode region is a cathode region and, in the case of a field effect transistor, this electrode region is a source region.

In accordance with the invention, a semiconductor substrate is provided, of appropriate conductivity type and conductivity for the base region. Preferably, the semiconductor substrate is of crystallographic orientation selected to facilitate preferential etching.

A plurality of grids of the opposite conductivity type are formed in one surface of the substrate, with the grids having substantially vertical walls with a well defined interface between the grids and the surrounding substrate. Preferably, these grids are elongated, and are formed by providing an etchant barrier with parallel elongated windows on one surface of the substrate, and then selectively etching the substrate to form substantially vertically-walled grooves beneath the elongated windows, and then refilling the grooves by means of vapor phase epitaxial growth with semiconductor of the opposite conductivity type and then removing the etchant barrier.

Next, a semiconductor layer of the one conductivity type and of conductivity corresponding to that of the base region is epitaxially grown over the substrate surface and over the grid so as to bury the grids. The epitaxially-grown layer and the substrate surrounding the grids together define the base region.

Finally, a substantially uniform region of the one conductivity type, but of higher conductivity than the base region, is formed by diffusion in the surface of the epitaxially-grown layer to form the electrode region. This electrode region layer may be formed either by diffusion in the surface of the base region epitaxially-grown layer, or by epitaxial growth.

Thereafter, contacts to the buried grid are formed.

Alternatively, the elongated grids with substantially vertical walls may be formed through a process known as Temperature Gradient Zone Melting (TGZM) such as is disclosed in the following commonly-assigned U.S. Patents: Cline et al, U.S. Pat. No. 3,899,362, Anthony et al. U.S. Pat. No. 3,904,442, Chang et al U.S. Pat. No. 3,998,661, Krishna U.S. Pat. No. 3,998,772, Anthony et al U.S. Pat. No. 3,982,268, Anthony et al U.S. Pat. No. 3,979,230, Anthony et al U.S. Pat. No. 3,979,820 Anthony, et al. U.S. Pat. No. 3,998,662, and Cline et al U.S. Pat. No. 4,006,040.

Still alternatively, the plurality of elongated grids with vertical sidewalls may be formed by ion implantation, such as is described in D. P. Lecrosnier et al., "Ion-Implanted FET for Power Applications", *IEEE Transactions on Electron Devices*, Vol. ED-21, pp. 113–118, (1974).

Briefly, and in accordance with another overall concept of the invention, there is provided a method for fabricating rectangular cross-section buried grid structures for vertical channel electric field devices, as well as similar structures in other devices, without the problems caused by autodoping.

In accordance with this concept of the invention, the buried grid structure is fabricated using a multiple step epitaxial refill process. Depressions, such as grooves or elongated grooves, are preferentially etched in a suitable substrate to achieve steep vertical walls in the presence of an etch masking layer such as silicon dioxide between the grooves. Thereafter, the grooves are either partially filled with P+ silicon for the grid structure, or the grooves are completely refilled and then again preferentially etched to remove a predetermined fraction of the grid semiconductor material. A second epitaxial refill is performed to fill the remainder of the grooves with N− type silicon corresponding to the base region.

During the second epitaxial refill autodoping can occur. However, because the epitaxial refill is confined to the region above the P+ grid, and because the surface region between the grooves is protected by the masking layer, the autodoping only extends the grid region upwards by a few microns, and cannot cause shorting between the adjacent grids.

In accordance with a more particular aspect of the invention, there is provided a method of fabricating, with minimum autodoping effect, a buried grid structure for a vertical channel electric field device. First, a substrate of appropriate conductivity and conductivity type for the base region and having a crystallographic orientation selected to facilitate preferential etching is provided. Next, an etchant barrier with suitable windows is formed on one surface of the substrate, and the substrate is preferentially etched to form substantially vertically-walled grooves beneath the windows. Preferably, the windows are elongated and parallel, and the grooves are correspondingly elongated. Next, the grooves are refilled, by means of vapor phase epitaxial growth, with semiconductor material of the opposite conductivity type to form grids. The refilled grids are selectively etched to remove a predetermined fraction of the semiconductor material of the opposite conductivity type to define the thickness of the grid. The grooves are again refilled with semiconductor material of the one conductivity type and of conductivity appropriate for the base region by means of vapor phase epitaxial growth so as to bury the grids. The refill material of the one conductivity type and the substrate surrounding the grooves together define the base region. Finally, the etchant barrier is removed, and a substantially uniform region of the one conductivity type is formed at the surface of the base region to form the electrode region. Finally, contacts to the buried grids are formed.

Briefly, and in accordance with another particular aspect of the invention, rather than completely refilling the grooves with semiconductor material of the opposite conductivity type, and then selectively etching the refilled groove to remove a predetermined fraction of the semiconductor material of the opposite conductivity type, the grooves may be only partially filled in the first place.

It should be noted that aspects of the present invention have been disclosed in literature published less than one year prior to the filing date hereof. Specifically: B. J. Baliga, "A Novel Buried Grid Device Fabrication Technology", *IEEE Electron Device Letters,* Vol. EDL-1, No. 12, pp. 250-252, (December 1980).

BRIEF DESCRIPTION OF THE DRAWINGS

While the novel features of the invention are set forth with particularity in the appended claims, the invention, both as to organization and content, will be better understood and appreciated with other aspects and features thereof from the following detailed description, taken in conjunction with the drawings, in which:

FIG. 1 is a sectioned isometric view depicting an early step in the fabrication of a field controlled device in accordance with one aspect of the invention, wherein a substrate with an oxide layer has been provided with a mask;

FIG. 2 depicts the FIG. 1 device after preferential etching;

FIG. 3 depicts the FIG. 2 device after epitaxial refill;

FIG. 4 depicts the FIG. 3 device after growing of the epitaxial layer to bury the grid region, followed by diffusion of the cathode or source region;

FIG. 5 is a sectional side view depicting an initial step in accordance with another aspect of the invention;

FIG. 6 depicts the FIG. 5 device following preferentially etching deep grooves;

FIG. 7 depicts the FIG. 6 device after completely refilling the grooves with P+ silicon for the grid regions;

FIG. 8 depicts a second preferential etching step to partially remove the refill;

FIG. 9 depicts a second planar epitaxial refill to bury the grids; and

FIG. 10 depicts a step in accordance with another aspect of the invention, which alternately follows the step of FIG. 6 in place of the steps of FIGS. 7 and 8.

DESCRIPTION OF THE PREFERRED EMBODIMENTS

With reference first to FIGS. 1-4, there is illustrated a method in accordance with one aspect of the invention for fabricating vertical channel electric field controlled devices, and buried grid structures for such devices.

Initially, a silicon semiconductor substrate 20 is provided, lightly phosphorus-doped so as to be N− type semiconductor material of appropriate conductivity for the base region 22 of the device. To facilitate subsequent preferential etching, the substrate 20 has particular crystallographic orientation to facilitate such etching. As one example, the substrate 20 is a phosphorus-doped, float zone silicon substrate with a <110> crystallographic orientation, which provides a set of <111> planes in the silicon lattice incident at right angles to the <110> surface.

Provided on the lower surface 24 of the substrate 20 is a lower electrode layer 26. The electrode layer 26, may be formed, through a diffusion technique, either before, after, or during the steps in accordance with the invention hereinafter described in detail. Alternatively, the lower layer 26 may be the initial layer in the device fabrication process, with the base region layer 22 then epitaxially grown on the layer 26, while maintaining crystallographic orientation. If the device being fabricated is an N-channel field effect transistor then the lower layer 26 is a drain region of N+ type conductivity. If the device being fabricated is a field controlled thyristor having rectifying characteristics, then the layer 26 is an anode region of P+ type conductivity. Not illustrated is conventional metallization applied in ohmic contract with the layer 26 to form the actual drain or anode terminal, as the case may be.

To form a plurality of elongated grids with substantially vertical walls, an etchant barrier 28 (FIG. 2) is first provided, having parallel elongated windows 30. While various forms of etchant barrier are possible, in the preferred embodiment the upper surface of the silicon wafer 20 is thermally oxidized to form a silicon dioxide layer 28 (FIG. 1), and a conventional photoresist mask 32 having windows 34 is applied over the oxide layer 28. Thereafter, a suitable etchant is used to dissolve the FIG. 1 oxide layer 28 under the windows 34, and the mask 32 is subsequently removed. As illustrated in FIG. 2, the remaining portions of the oxide 28 then comprise the actual etchant barrier. To facilitate the preferential etching, the resultant windows 30 in the oxide 28 are crystallographically oriented along the <211> direction.

Using known preferential etching techniques, the substrate 20 is preferentially etched to form substantially vertically walled grooves 38 beneath the windows 30, with very little undercutting below the oxide 28. By way of example, an etching mixture of potassium hydroxide and isopropanol in a ratio of approximately 3:1 etches silicon at a rate of approximately 5 microns per hour when the mixture is maintained at approximately 60° C. Other orientation-dependent etches may also be employed in practicing the invention as, for example, described in an article by D. L. Kendall, entitled "On Etching Very Narrow Grooves in Silicon", *Appl. Phys. Lett.*, Vol. 26, pp. 195-198 (1975), the entire disclosure of which is hereby expressly incorporated by reference. The Kendall article discusses in greater detail specific masking and etching steps, as well as temperature and rate of etching. This etching technique is also described in the above-identified commonly-assigned Baliga et al application Ser. No. 169,853.

While the preferred method of forming elongated grids with substantially vertical walls is the selective etch and refill technique just described, other techniques may be employed. As one example, the elongated grids with substantially vertical walls may be formed through a process known as Temperature Gradient Zone Melting (TGZM) such as is disclosed in the following commonly-assigned U.S. Patents: Cline et al, U.S. Pat. No. 3,899,362, Anthony et al U.S. Pat. No. 3,998,662, Anthony et al U.S. Pat. No. 3,904,442, Chang et al U.S. Pat. No. 3,998,661, Krishna U.S. Pat. No. 3,998,772, Anthony et al U.S. Pat. No. 3,982,268, Anthony et al U.S. Pat. No. 3,979,230, Anthony et al U.S. Pat. No. 3,979,820, and Cline et al U.S. Pat. No. 4,006,040, the entire disclosures of which are hereby expressly incorporated by reference.

As another example, the plurality of elongated grids with vertical sidewalls may be formed by ion implantation, such as is described in D. P. Lecrosnier et al., "Ion-Implanted FET for Power Applications" *IEEE Transactions on Electron Devices*, Vol. ED-21, pp. 113-118 (1974).

Next, and with reference to FIG. 3, to form grids the grooves 38 are selectively refilled with semiconductor material 40 of the opposite conductivity type, for example P+ type silicon, by means of vapor phase epitaxial growth. By way of example, a mixture of dichlorosilane and hydrogen chloride, in the presence of diborane for P-type doping, may be employed to obtain planar epitaxial refill in the grooves 38 under conditions which prevent the occurrance of voids.

The etchant barrier comprising the remaining oxide portions 28 is then removed.

Next, an N− type semiconductor layer 42 is epitaxially grown over the substrate surface and over the grids 40 so as to bury the grids 40, the epitaxially grown layer 42 and the substrate 20 surrounding the grids 40 together defining the complete base region of the device.

The conductivity type and conductivity of the layer 42 is therefore selected to match that of the substrate 20.

Next, to define an electrode region an N+ layer 44 is formed at the upper surface of the layer 42. Preferably, this layer 44 is a diffused layer, but it will be appreciated that the layer 44 may as well be formed by further epitaxial growth, with appropriate dopant. This layer 44 is a cathode in the case of a field controlled thyristor and a source electrode in the case of a field effect transistor.

Finally, contacts to the buried grids 40 are formed. These contacts may be formed in a number of ways. For example, metallization at the periphery of the substrate 20, through spaced windows opened through the layers 44 and 42 during a separate mask and etch procedure, or through diffusion to form a highly conductive channel through the layer 42.

As an example of dimensions in the devices of the invention, buried grid field controlled devices may have an active area of 100 by 100 mils. The buried grid fingers 40 may have a width of 10 microns, with a separation of 10 microns, for a 20 micron repeat distance. A suitable channel between the grids has a length (top to bottom) of 7 microns and a width of 7 microns.

In the operation of typical field controlled thyristor wherein the electrode region 44 is a N+ cathode, and the electrode region 26 is a P+ anode, the grids 40 are reversed biased with respect to the cathode 44 through application of a negative voltage, thereby causing the formation of a depletion region to inhibit or completely block conduction vertically through the device. The magnitude of the depletion region varies with the magnitude of the applied voltage to the grid channels 40.

Thus, such a device is normally on and requires a gate drive voltage to hold it in the off (blocking) state. For the development of the high voltage power devices, an important parameter is the blocking gain. For these devices, the blocking gain is defined as the ratio of anode or drain voltage to the gate voltage at a specified leakage current flow. Accordingly, it will be appreciated that a large blocking gain is important for minimizing the gate drive circuit requirements. Blocking gains exceeding 200 can be achieved.

The particular process described above with reference to FIGS. 1-4 however has potential autodoping problems during growth of the epitaxial layer 42 of FIG. 4. In particular, P type dopant from the grid fingers 40 enters the gas phase during initial stages of epitaxial growth, and this has the potential to produce a short between the grid fingers 40. This particular problem, or at least its effects, are eliminated in the method depicted in FIGS. 5-9, based on a preferential etch and planar epitaxial refill technique.

While the process of the invention for vapor phase epitaxial growth with the avoidance of autodoping problems is described below with reference to the fabrication of a buried grid region in a vertical channel electric field controlled device, it will be appreciated that its applicability is not so limited. Rather, the process of the invention may also be utilized for the fabrication of similar buried structures in other devices.

Referring now to FIG. 5, a semiconductor substrate 50 is provided, corresponding to the base region. As in the embodiment described above with reference to FIGS. 1-4, the substrate 50 is preferably phosphorus-doped, float zone silicon substrate with a <110> crystallographic orientation to facilitate preferential etching. An etchant barrier in the form of an oxide layer 52 is formed on one surface of the substrate, with parallel elongated windows 54, in the manner which may be identical to that which was described above with reference to FIGS. 1 and 2 to form the oxide strips 28 of FIG. 2. As previously described, the windows 54 are crystallographically oriented along the <211> direction.

Next, as illustrated in FIG. 6, the silicon substrate 50 is preferentially etched in a highly orientation dependant etch, such as a mixture of potassium hydroxide and isopropanol. As a result, vertically-walled, deep grooves 56 are formed, similar to, although deeper than, the grooves 38 of FIG. 2.

Next, as illustrated in FIG. 7 a planar epitaxial refill 58 in the grooves 56 is obtained under conditions which prevent the occurence of voids, employing for example a mixture of dichlorosilane and hydrogen chloride in the presence of diborane for the P type doping.

Next, as illustrated in FIG. 8, the refilled grooves 56 are again etched with the same preferential etch solution. However, care is taken to remove only a desired fraction of the P+ semiconductor material, the remaining portion 58' of which defines the actual grids.

Next, as illustrated in FIG. 9, a second selective epitaxial deposition is performed using the same epitaxial growth technique as before, but with the diborane replaced with phosphine in order to obtain the desired N− type refill regions 60. As a result, rectangular shaped buried grids are formed.

Finally, the oxide 52 is removed, and an electrode region similar to that of FIG. 4 is formed.

It is significant to note that, during the epitaxial refill of FIG. 9, autodoping can occur. However, since the epitaxial growth is confined to the immediate region above the P+ grid portion 58', the autodoping only extends the grid region upward by a few microns, and cannot cause shorting between the adjacent grids. Further, the oxide mask 52 is retained between the grid regions throughout the entire buried grid fabrication procedure, eliminating any possibility of a P− type connecting layer between the grids due to the autodoping effects.

Further, possible isolation of the N refill 60 of FIG. 9 due to P doping of the sidewalls 56 during the first refill of FIG. 7 is prevented from occurring because any sidewall P region is etched away during the second preferential etch step (FIG. 8).

In this buried grid fabrication technique, the length of the buried grid region 58, as well as its depth from the wafer surface, can be accurately controlled because these dimensions are determined by the etch rate of silicon in the preferential etch (which is approximately 5 microns per hour). It will be appreciated that, in the design of specific devices to be manufactured according to the subject techniques, the effect of solid state diffusion of the boron during the high temperature epitaxial growth steps must be considered.

Finally, with reference to FIG. 10, a modification of the method of FIGS. 5 to 9 is depicted wherein, rather than a complete refill and subsequent partical etch as illustrated in FIGS. 7 and 8, the grooves 56 are only partially refilled in the first place, as shown in FIG. 10. The grooves 56 are then refilled completely as in FIG. 9. This particular procedure however is somewhat susceptible to P doping of the channel sidewalls, with subsequent isolation of the N refill. In order to avoid this, it is advisable to lightly etch the groove prior to the N refill.

Accordingly, it will be appreciated that by the present invention there are provided improved grid fabricating techniques particularly applicable to field controlled devices, but having other uses as well. In the preferred embodiments, autodoping problems, or at least their effects, are eliminated through a combination of preferential etching and epitaxial refill techniques. The rectangular shape of the buried grids resulting from the processes of the subject invention is ideally suited for the development of high voltage field controlled devices. Field controlled devices fabricated in accordance with the invention exhibit very high blocking gain.

While specific embodiments of the invention have been illustrated and described herein, it is realized that modifications and changes will occur to those skilled in the art. It is therefore to be understood that the appended claims are intended to cover all such modifications and changes as fall within the true spirit and scope of the invention.

What is claimed is:

1. A method of fabricating, with minimal autodoping effect, a buried grid structure for a vertical channel electric field device of the type including a semiconductor base region of one conductivity type, a grid structure of opposite conductivity type buried in the base region, and a substantially uniform electrode region of the one conductivity type but of higher conductivity than the base region at one surface of the base region, said method comprising:

providing a semiconductor substrate of the one conductivity type, of appropriate conductivity for the base region, and of crystallographic orientation selected to facilitate preferential etching;

forming a mask with windows on one surface of the substrate, said mask constituting a combined etchant barrier and epitaxial growth barrier;

preferentially etching the substrate to form substantially vertically-walled grooves beneath the windows while utilizing said mask as an etchant barrier;

epitaxially refilling the grooves with semiconductor material of the opposite conductivity type to form grids while utilizing said mask as an epitaxial growth barrier;

preferentially etching the refilled grooves to remove a predetermined fraction of the semiconductor material of the opposite conductivity type to define the thickness of the grids while utilizing said mask as an etchant barrier;

refilling the grooves with semiconductor material of the one conductivity type and of appropriate conductivity for the base region by means of vapor phase epitaxial growth so as to bury the grids while utilizing said mask as an epitaxial growth barrier, the refilling material of the one conductivity type and the substrate surrounding the grooves together defining the base region;

removing said mask;

forming a substantially uniform region of the one conductivity type but of higher conductivity than the base region in the surface of the base region to form the electrode region; and forming contacts to the buried grids.

2. A method in accordance with claim 1, wherein the windows, the grooves, and the grids are of elongated shape.

3. A method in accordance with claim 2, wherein the elongated windows, the grooves, and the elongated grids are respectively formed generally parallel to each other.

4. A method in accordance with claim 1, wherein the device which is fabricated is a field controlled thyristor and the electrode region which is formed is a cathode region.

5. A method in accordance with claim 1, wherein the device which is fabricated is a field effect transistor and the electrode region which is grown is a source region.

6. A method in accordance with claim 3, wherein the semiconductor substrate comprises silicon with a <110> surface crystallographic orientation and with a set of <111> planes at right angles to the <110> surface, and the elongated windows are defined along the <211> direction.

7. A method of fabricating, with minimal autodoping effect, a buried grid structure for a vertical channel electric field device of the type including a semiconductor base region of one conductivity type, a grid structure of opposite conductivity type buried in the base region, and a substantially uniform electrode region of the one conductivity type but of higher conductivity than the base region, said method comprising:
providing a semiconductor substrate of one conductivity type, of appropriate conductivity for the base region, and a crystallographic orientation selected to facilitate preferential etching;
forming a mask with windows on one surface of the substrate, said mask constituting a combined etchant barrier and epitaxial growth barrier;
preferentially etching the substrate to form substantially vertically-walled grooves beneath the windows while utilizing said mask as an etchant barrier;
partially refilling the grooves with semiconductor material of the opposite conductivity type by means of epitaxial growth to form grids while utilizing said mask as an epitaxial growth barrier;
completing the refilling of the grooves with semiconductor material of the one conductivity type and of appropriate conductivity for the base region by means of vapor phase epitaxial growth so as to bury the grids while utilizing said mask as an epitaxial growth barrier, the refilling material of the one conductivity type and the substrate surrounding the grooves together defining the base region;
removing said mask;
forming a substantially uniform region of the one conductivity type but of higher conductivity than the base region in the surface of the base region to form the electrode region; and
forming contacts to the buried grids.

8. A method in accordance with claim 7, wherein the windows, the grooves, and the grids are of elongated shape.

9. A method in accordance with claim 8, wherein the elongated windows, the grooves, and the elongated grids are respectively formed generally parallel to each other.

10. A method in accordance with claim 7, wherein the device which is fabricated is a field controlled thyristor and the electrode region which is formed is a cathode region.

11. A method in accordance with claim 7, wherein the device which is fabricated is a field effect transistor and the electrode region which is formed is a source region.

12. A method in accordance with claim 9, wherein the semiconductor substrate comprises silicon with a <110> surface crystallographic orientation and with a set of <111> planes at right angles to the <110> surface, and the elongated windows are defined along the <211> direction.

13. A method of fabricating, in a semiconductor device layer of one conductivity type, and with minimal autodoping effect, a buried region of opposite conductivity type, said method comprising:
providing the semiconductor layer of the one conductivity type;
forming a mask with at least one window on one surface of the layer, said mask constituting a combined etchant barrier and semiconductor growth barrier;
etching the layer to form a substantially vertically-walled depression beneath the window while utilizing said mask as an etchant barrier;
partially refilling the depression with semiconductor material of the opposite conductivity type to define the region to be buried while utilizing said mask as a semiconductor growth barrier;
refilling the depression with semiconductor material of the one conductivity type by means of vapor phase epitaxial growth so as to bury the semiconductor material of the opposite conductivity type while utilizing said mask as a semiconductor growth barrier; and
removing said mask.

14. A method in accordance with claim 13, wherein the semiconductor layer provided is of crystallographic orientation selected to facilitate preferential etching, and the substantially vertically-walled depression is formed by preferential etching beneath the window.

15. A method in accordance with claim 14, wherein the step of partially refilling depression comprises:
epitaxially refilling the depression with semiconductor material of the opposite conductivity type;
preferentially etching the refilled depression to remove a predetermined fraction of the semiconductor material of the opposite conductivity type.

16. A method in accordance with claim 14, wherein the step of partially refilling the depression comprises partially epitaxially refilling the depression with semiconductor material of the opposite conductivity type.

17. A method in accordance with claim 14, wherein the window which is formed is of elongated shape, the depression which is formed is an elongated groove, and the buried region which is formed is of elongated shape.

18. A method in accordance with claim 17, wherein the semiconductor layer comprises silicon with a <110> surface crystallographic orientation, and with a set of <111> planes at right angles to the <110> surface, and the elongated window is formed along the <211> direction.

* * * * *